(12) United States Patent
Visokay et al.

(10) Patent No.: US 6,969,644 B1
(45) Date of Patent: Nov. 29, 2005

(54) VERSATILE SYSTEM FOR TRIPLE-GATED TRANSISTORS WITH ENGINEERED CORNERS

(75) Inventors: Mark R. Visokay, Richardson, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/930,273

(22) Filed: Aug. 31, 2004

(51) Int. Cl.[7] .......................................... H01L 21/336
(52) U.S. Cl. ...................... 438/197; 438/269; 438/283; 438/481
(58) Field of Search ........................ 438/197, 268–270, 438/272, 283, 157

(56) References Cited

U.S. PATENT DOCUMENTS

| | | | |
|---|---|---|---|
| 5,899,719 A * | 5/1999 | Hong | 438/289 |
| 6,077,747 A * | 6/2000 | Nakamura | 438/291 |
| 6,368,925 B2 * | 4/2002 | Weon et al. | 438/289 |
| 6,709,982 B1 * | 3/2004 | Buynoski et al. | 438/696 |
| 6,858,478 B2 * | 2/2005 | Chau et al. | 438/149 |
| 2005/0093028 A1 * | 5/2005 | Chambers | 257/250 |
| 2005/0095764 A1 * | 5/2005 | Chambers et al. | 438/197 |

* cited by examiner

*Primary Examiner*—T. N. Quach
(74) *Attorney, Agent, or Firm*—Peter K. McLarty; W. James Brady, III; Frederick J. Telecky, Jr.

(57) ABSTRACT

The present invention provides a system for producing a triple-gate transistor segment (300), utilizing a standard semiconductor substrate (302). The substrate has a plurality of isolation regions (304) formed along its upper surface in a distally separate relationship, defining a channel region (306). A form structure (308) is disposed atop the isolation regions, and defines a channel body area (310) over the channel region. A channel body structure (316) is disposed within the channel body area, and is engineered to provide a blunted corner or edge (318) along a perimeter of its upper exposed surface. The form structure is then removed, and subsequent processing is performed.

11 Claims, 2 Drawing Sheets

VERSATILE SYSTEM FOR TRIPLE-GATED TRANSISTORS WITH ENGINEERED CORNERS

RELATED APPLICATIONS

This application is related to U.S. patent application Ser. No. 10/696,130, filed on Oct. 29, 2003, entitled MULTIPLE-GATE MOSFET DEVICE WITH LITHOGRAPHY INDEPENDENT SILICON BODY THICKNESS AND METHODS FOR FABRICATING THE SAME, and to U.S. patent application Ser. No. 10/696,539, filed on Oct. 29, 2003, entitled TRIPLE GATE MOSFET TRANSISTOR AND METHODS FOR FABRICATING THE SAME, U.S. Pat. No. 6,927,106.

TECHNICAL FIELD OF THE INVENTION

The present invention relates generally to the field of semiconductor devices and, more particularly, to apparatus and methods for the production of triple-gated transistors.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size.

As integrated circuits become denser, the dimensions of metal structures interconnecting transistors, channels between contacts, and other device features within an integrated circuit are significantly reduced—significantly altering the physical and electrical properties of those features. Consider, for example, reductions in the length of a CMOS transistor gate and, correspondingly, the length of a channel between source and drain structures of the transistor. Often, such reductions are prompted by requirements for increased drive current performance—especially for operation at reduced gate voltages.

The length of the gate structure is typically the smallest dimension in a planar transistor. Unfortunately, most conventional fabrication processes (e.g., lithography) are limited in their ability to reliably produce transistor features of extremely small dimension. In addition to fabrication process limitations, performance limitations are also a barrier to significant reductions in planar transistor gate lengths. Typically, reduced gate length can result in short channel effects that degrade transistor performance.

In CMOS devices having long channel lengths, gate voltage and a resulting field primarily control depletion of charge under the gate. In short channel devices, however, the channel region is also affected by source and drain voltages—causing an increased off-state current, due to VT roll-off, decreased sub-threshold slope, and degraded output current. In addition, since a lower gate voltage depletes a shortened channel, the barrier for electron injection from the source to the drain decreases—a phenomenon commonly referred to as drain induced barrier lowering (DIBL).

In response to these considerations and concerns, some have begun to design and produce multiple gate transistors—transistors that are non-planar. In theory, these designs provide more control over short channel structures by situating gate structure around two or more sides of the channel. Often these designs take the form of triple-gated transistors—transistors where gate structure is formed three dimensionally along three sides of a channel structure. In a number of conventional triple-gate processes, an SOI wafer is provided. The SOI wafer comprises a substrate, with an overlying oxide insulator, and a thin silicon layer above the oxide. Usually, a portion of the upper silicon layer is etched away leaving an isolated block of silicon that becomes the channel structure. A gate is then deposited or formed around the silicon block. The ends of the block are then doped to form source and drain regions.

Although such approaches are capable of producing multiple gate devices that offer improved performance over planar transistor designs, a number of production, performance and reliability issues still preclude their commercial viability in high-volume semiconductor fabrication. SOI wafers tend to be significantly more expensive than ordinary silicon substrates. Considerable overhead is added to fabrication processes by the etching processes involved in forming channel structures. Furthermore, channel surfaces exposed to the etch processes can incur damage that degrades their structural and electrical integrity throughout the lifetime of the device. Even if etch processes successfully form a channel structure, the physical form of the resulting channel structure may inherently cause a number of problems.

In most cases, etch and deposition processes used to form a triple-gate transistor will produce a channel block having squared, right-angle edges—particularly along the upper surface of the block (i.e., the surface farthest from substrate bulk). Subsequently, any gate structure formed over the block will also have squared, right-angled edges—particularly along the surface in direct contact with the channel block (i.e., the gate/channel interface). Sharp angles within semiconductor structures introduce structural discontinuities and instabilities (e.g., lattice structure instability) to those structures. Furthermore, such structures are inherently thicker at the edges than along the surfaces, resulting in differing performance characteristics or parameters (e.g., $V_T$).

Some attempts have been made to round the upper edges of triple-gate channel blocks. Most such attempts rely on annealing or otherwise enhancing atomic rearrangement of the channel block, until surface tension begins to round the edges. Unfortunately, most such approaches have no way to selectively round only the upper edges of the channel block. As a result, rounding also occurs along the lower edges of the channel block (i.e., interface between the channel block and the substrate), and a channel structure resembling a quasi-cylindrical furrow is formed. This creates a number of performance problems, and complicates subsequent processing steps.

As a result, there is a need for a system that produces multiple-gated transistor structures in a commercially viable fabrication technology, one that provides selective engineering of certain structural features, such as channel edges, while optimizing device performance and reliability in an easy, efficient and cost-effective manner.

SUMMARY OF THE INVENTION

The present invention provides a versatile system, comprising a number of apparatus and methods, for producing multiple-gated transistor structures having selectively engineered corners and edges. Certain performance and reliability concerns commonly associated with conventional methods are obviated by structures according to the present invention. Comprehending the increased costs associated with SOI-based methods, the system of the present invention is readily implemented in or adaptable to a wide variety of commercially viable fabrication technologies. The system of the present invention thus overcomes a number of difficulties inherent in conventional approaches while optimizing device performance and reliability in an easy, efficient and cost-effective manner.

The present invention recognizes that, during the formation and processing of certain semiconductor device structures, it may be necessary to tailor targeted portions of a single structure, without altering the remainder of that structure. This is especially true of silicon body structures utilized in the formation multiple-gate transistors. For a number of structural, performance and reliability reasons, it may be desirable to blunt or otherwise nullify square corners or edges along the upper portion of a silicon body structure (i.e., the portion of the structure opposite the silicon bulk). Such an approach should greatly reduce or eliminate, however, any blunting or rounding of corners or edges along the lower portion of the silicon body structure.

The system of the present invention provides a protective form about the perimeter of a silicon body structure. The form provides operational access to the upper surface region of the silicon body structure while protecting and maintaining the structural form and integrity of the structure's lower portion. Embodiments of the present invention provide varying fabrication and processing techniques for blunting corners or edges along the upper surface region of the silicon body structure. These techniques may be utilized independently or in concert to optimally render those areas. Once the silicon body structure has been tailored in a desired manner, the protective form may be removed for subsequent processing.

More specifically, embodiments of the present invention provide a system, comprising various structures and methods, for producing a triple-gate transistor segment, utilizing a standard semiconductor substrate. The substrate has a plurality of isolation regions formed along its upper surface in a distally separate relationship, defining a channel region. A form structure is disposed atop the isolation regions, and defines a channel body area over the channel region. A channel body structure is disposed within the channel body area, and is engineered to provide a blunted corner or edge along a perimeter of its upper exposed surface. The form structure is then removed, and subsequent processing is performed.

Other embodiments of the present invention provide a semiconductor device segment (e.g., a triple-gate transistor segment) that has a substrate with a plurality of isolation regions formed along its upper surface. The isolation regions are formed in a distally separate relationship, defining a channel region. A channel body is formed atop the upper surface of the substrate over the channel region. The channel body has a sidewall, a top surface, and a blunted edge or corner along a perimeter of its top surface.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The present invention is hereafter illustratively described in conjunction with the formation of a triple-gate CMOS transistor. The specific embodiments discussed herein are, however, merely demonstrative of specific ways to make and use the invention and do not limit the scope of the invention.

Comprehending certain structural, performance and reliability issues inherent in conventional multiple-gate transistor formation, the present invention recognizes that it may be desirable to tailor certain device structures—particularly silicon body structures, utilized as channels—in a selective manner. The present invention further recognizes that it may be desirable to blunt or otherwise nullify square corners or edges along the upper portion of a silicon body structure (i.e., the portion of the structure opposite the silicon bulk). The present invention also recognizes that any blunting or rounding of corners or edges along the lower portion of the silicon body structure should be minimized or eliminated.

In response, the system of the present invention provides a protective form about the perimeter of a silicon body structure, as that structure is initially processed. The form provides operational access to the upper surface region of the silicon body structure, while protecting and maintaining the structural form and integrity of the silicon body's lower portion. Embodiments of the present invention provide fabrication and processing techniques for blunting corners or edges along the upper surface region of the silicon body structure. These techniques may be utilized independently, or combined to render an optimal contour in those areas. Once the silicon body structure has been tailored in a desired manner, the protective form may be removed for subsequent device processing.

Figure 1A:
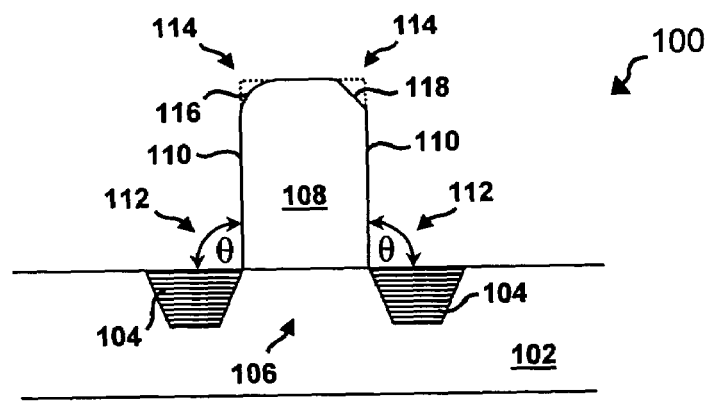
FIGS. 1a–1b provide illustrations depicting certain aspects of a semiconductor device segment in accordance with the present invention.

Certain aspects of the present invention are described now in greater detail, beginning with reference to a semiconductor device segment 100 as depicted in FIG. 1a. Segment 100 provides an illustration of a cross-sectional portion of a triple-gated transistor during its formation in accordance with the present invention. Segment 100 comprises a standard bulk substrate 102 (e.g., a silicon wafer). Substrate 102 comprises a plurality of isolation regions 104 disposed in a distally separate relationship along its upper surface. Regions 104 form the boundary of or otherwise define a channel region 106. Regions 104 may comprise any suitable channel isolation material, such as an isolation oxide (e.g., $SiO_2$), and may be formed or deposited along substrate 102 by any suitable fabrication process (e.g., implant, lithography). In the area bounded by regions 104 atop the substrate surface (i.e., the area atop region 106), a channel body 108 is formed. Body 108 comprises any suitable material that is matched to or compatible with the material in region 106. For example, body 108 may comprise epitaxial silicon. Body 108 is formed of a height sufficient to ensure that its sidewalls 110 provide sufficient support for processing in accordance with the present invention and, ultimately, sufficient support for and contact with vertical portions of a triple-gate structure.

Figure 1B:
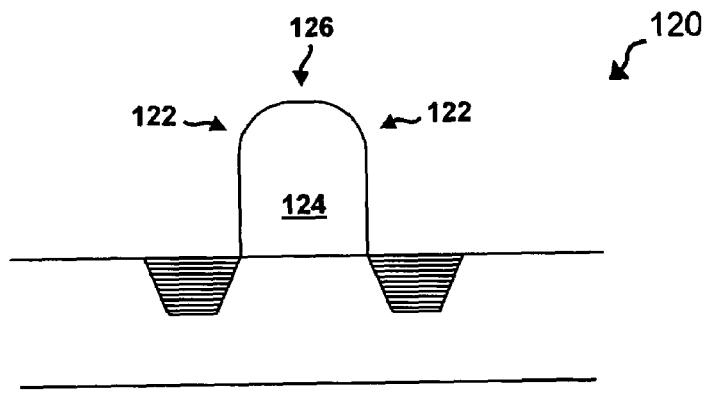

Sidewalls 110 form a substantially right angle 112 (θ) with the upper surface of substrate 102 (i.e., the upper surfaces of regions 104). Body 108 is blunted along its upper corners or edges 114, such that those corners or edges are not squared right angles. In some embodiments of the present invention, a corner or edge may be blunted by rounding, as depicted by corner 116. In other embodiments of the present invention, a corner or edge may be blunted by one or more gradations or facets, as depicted by corner 118. The degree to which each corner or edge 114 is blunted may be varied from nominal to severe, depending upon the materials and processes used, or upon the desired structural or performance properties. For example, FIG. 1b illustrates one embodiment of a semiconductor device segment 120, similar to segment 100, for which the blunting of the upper corners 122 of the channel body 124 is severe. For segment 120, corners 122 are rounded, such that the entire upper portion 126 of body 124 is rounded from sidewall to sidewall.

Figure 2:
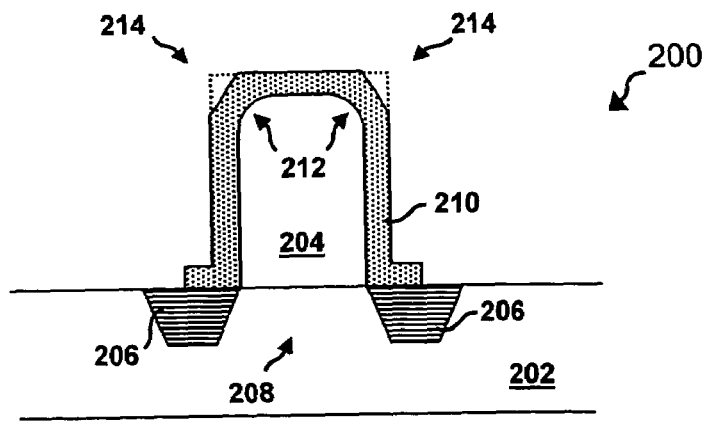
FIG. 2 provides another illustration depicting certain aspects of a semiconductor device segment in accordance with the present invention.

Regardless of the degree of blunting utilized, a subsequent layer or structure deposited or formed atop the channel body is provided with greater structural stability by its interface therewith. Furthermore, the blunting of the present invention eliminates performance variations or deviances resulting from uneven thickness of a subsequent layer or structure around the upper corners or edges of the channel body. This is illustrated now with reference to a semiconductor device segment 200 as depicted in FIG. 2. Segment 200 provides further illustration of a cross-sectional portion of a triple-gated transistor during its formation in accordance with the present invention. Segment 200 comprises a standard bulk substrate 202 (e.g., a silicon wafer), atop which a channel body 204 has been formed in accordance with the present invention. Substrate 202 comprises isolation regions 206, disposed along its upper surface and forming the boundary of a channel region 208.

A transistor layer or structure 210 (e.g., gate dielectric) is formed or deposited atop body 204. Depending upon its composition, or upon the process(es) used to form it, structure 210 follows or closely approximates the contour of upper corners 212 of body 204. Thus, structure 210 has a substantially uniform thickness in its traverse across body 204, even around corners 212. This eliminates performance issues, such as $V_T'$ variance, that might otherwise occur if structure 210 had square, right-angled corners 214. The structural discontinuities and instabilities that might otherwise occur if structure 210 had right-angled corners 214 are also obviated.

Figure 3A:
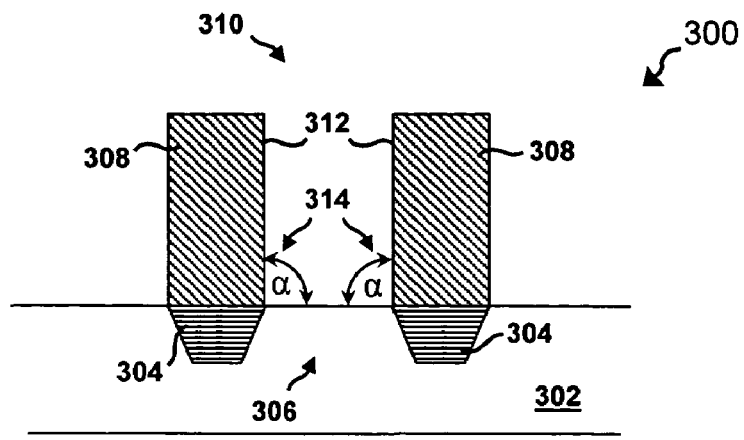
FIGS. 3a–3c provide illustrations depicting certain aspects of forming a semiconductor device segment in accordance with the present invention.
Figure 3B:
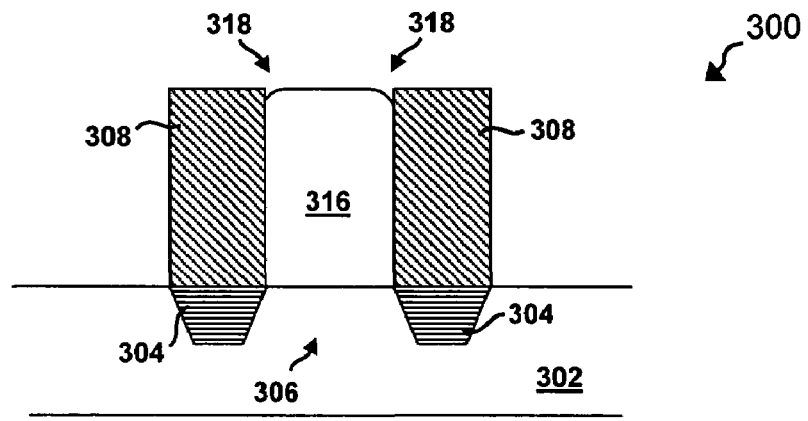
Figure 3C:
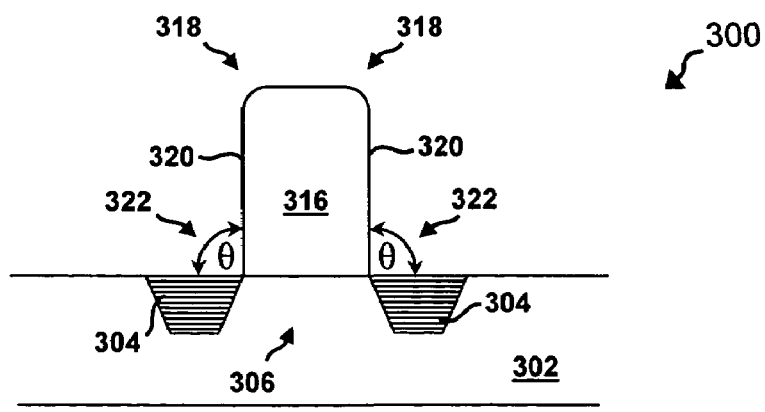

Further aspects of formation of a transistor according to the present invention are illustrated now with reference to FIGS. 3a–3c, which depict formation of a semiconductor device segment 300 in accordance with the present invention. Segment 300 is a cross-sectional portion of a triple-gated transistor. Segment 300 comprises a standard bulk substrate 302 (e.g., a silicon wafer). Substrate 302 comprises a plurality of isolation regions 304 disposed along its upper surface. Regions 304 form the boundary of and define a channel region 306. Regions 304 comprise any suitable channel isolation material, such as an isolation oxide (e.g., $SiO_2$), and may be formed or deposited along substrate 302 by any suitable fabrication process (e.g., implant, lithography).

A protective form structure 308 is formed or disposed atop the substrate surface, over regions 304—defining or otherwise providing a vertical boundary around an area 310 where a channel body will be formed or deposited. Channel body area 310 may comprise an opening or aperture formed in a contiguous or monolithic structure 308, or may comprise an enclosure formed by interconnecting portions of a segmented structure 308. Structure 308 may comprise any suitable material, such as a nitride (e.g., $Si_3N_4$), that provides a structure sturdy enough to withstand processing in accordance with the present invention, but is easily removable once that processing is over. The removal of structure 308 should not, however, adversely affect any of the other surrounding structures (e.g., isolation regions 304). Structure 308 may be formed utilizing a number of available fabrication processes. For example, structure 308 may be formed by depositing a nitride layer over the surface of substrate 302, patterning the nitride layer to appropriately define channel body area 310, and etching (e.g., dry etch, plasma etch) away a portion or portions of the nitride layer to open or otherwise expose area 310. After its formation, structure 308 provides sidewalls 312 to area 310. Sidewalls 312 form substantially right angles 314 (α) with the upper surface of substrate 302 at the perimeters of regions 304.

Once structure 308 is in place, a channel body 316 is formed or otherwise disposed within the area bounded by structure 308. While structure 308 is in place, upper edges or corners 318 of body 316 are engineered to provide blunting in accordance with present invention. Structure 308 is formed of a suitable shape and composition to securely support the formation of body 316 and engineering of corners 318. Once body 316 and corners 318 are complete, form structure 308 is removed by any suitable process (e.g., selective etch), as depicted in FIG. 3c. Body 316 is left intact, having blunted corners 318 and vertical sidewalls 320. Sidewalls 320 form a substantially right angle 322 (θ) with the upper surface of substrate 302 (i.e., the upper surfaces of regions 304).

Depending upon the processes and materials used, the formation of body 316 and engineering of corners 318 may be concurrent or sequential in nature. In some embodiments, for example, body 316 may be formed using epitaxial silicon formation. During the epitaxial process, certain crystalline orientations may be selectively formed to produce faceted corners 318.

In other embodiments, engineering of corners 318 may occur after the formation of body 316. In certain embodi ments, for example, epitaxial silicon may be formed to completely fill the area within structure 308, leaving corners 318 substantially squared. Segment 300 is then exposed to a suitable anneal process that results in a high surface diffusivity—promoting redistribution of atoms along upper surface of body 316 into their lowest energy state, causing corners 318 to reform and round. One example of a suitable anneal process is an $H_2$ anneal, performed in a range of 700° C.–1000° C. for about 1 minute.

In other embodiments, segment 300 may, alternatively, be exposed to a suitable CMP process that utilizes a crystallographically selective chemistry to expose a desired plane or facet at corners 318. In still other embodiments, segment 300 may, alternatively, be exposed to a suitable etch process (dry or wet) that utilizes a crystallographically selective chemistry to expose a desired plane or facet at corners 318. Other corner engineering processes, and variations or combinations of engineering processes, are comprehended hereby. For example, selective epitaxial formation of faceted corners 318 may be followed by an $H_2$ anneal process to round those corners.

Thus, with the benefit of the present invention, a sturdy but easily removable form structure is provided to facilitate the formation and engineering of a channel body for a multiple-gate transistor. Once the system of the present invention has successfully formed an optimal channel body, standard processing may resume to produce subsequent layers or structures (e.g., gate dielectric, gate electrode). Although presented and described in reference to certain geometries and materials, it should be apparent that the present invention is readily implemented in a wide variety of device manufacturing processes. For example, the present invention may be applied to processes using substrate or body materials other than silicon (e.g., $Si_XGe_{1-X}$, Ge, GaAs). The principles and techniques of the present invention may be applied in separate instances, either repetitively or concurrently. The principles and techniques of the present invention may also be utilized to engineer other structures within a transistor.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As stated throughout, many modifications and variations are possible in light of the above teaching without departing from the spirit and scope of the following claims.

What is claimed is:

1. A method of producing a triple-gate transistor segment, the method comprising the steps of:
   providing a substrate having an upper surface;
   forming a plurality of isolation regions along the upper surface of the substrate, in a distally separate relationship, defining a channel region;
   providing a form structure, disposed atop the isolation regions and defining a channel body area over the channel region;
   disposing a channel body structure, having an upper exposed surface, within the channel body area;
   engineering the channel body structure to provide a blunted corner or edge along a perimeter of the upper exposed surface of the channel body structure; and
   removing the form structure.

2. The method of claim 1, wherein the step of providing a substrate further comprises providing a bulk silicon wafer.

3. The method of claim 1, wherein the step of providing a form structure further comprises providing a form structure that comprises $Si_3N_4$.

4. The method of claim 1, wherein the step of providing a form structure further comprises providing a monolithic form structure having an aperture formed therein to define the channel body area.

5. The method of claim 1, wherein the step of disposing a channel body structure further comprises forming a channel body structure using an epitaxial process.

6. The method of claim 1, wherein the step of engineering the channel body structure further comprises utilizing a crystallographically selective epitaxial process to provide a faceted corner or edge.

7. The method of claim 1, wherein the step of engineering the channel body structure further comprises performing a chemical mechanical polish, on the upper exposed surface of the channel body structure, using a crystallographically selective chemistry to provide a faceted corner or edge.

8. The method of claim 1, wherein the step of engineering the channel body structure further comprises performing an etch on the upper exposed surface of the channel body structure, using a crystallographically selective chemistry, to provide a faceted corner or edge.

9. The method of claim 1, wherein the step of engineering the channel body structure further comprises annealing the upper exposed surface of the channel body structure to provide a rounded corner or edge.

10. The method of claim 9, wherein the step of annealing further comprises performing an $H_2$ anneal.

11. The method of claim 10, wherein the $H_2$ anneal is conducted in a range of 700° C. 1000° C., for about 1 minute.

\* \* \* \* \*